United States Patent
Chiang (10) Patent No.: US 6,378,105 B1
(45) Date of Patent: Apr. 23, 2002

(54) REED-SOLOMON MULTIPLICATION METHOD

(75) Inventor: Kevin Chiang, Fremont, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/317,810

(22) Filed: May 24, 1999

(51) Int. Cl.[7] ............................................. H03M 13/00
(52) U.S. Cl. ...................................... 714/784; 714/756
(58) Field of Search .................................. 714/756, 784

(56) References Cited

U.S. PATENT DOCUMENTS

| | | | | |
|---|---|---|---|---|
| 3,697,948 A | * | 10/1972 | Bossen ........................ | 714/755 |
| 4,404,674 A | * | 9/1983 | Rhodes ........................ | 714/793 |
| 4,703,485 A | * | 10/1987 | Patel ........................... | 714/779 |
| 4,706,250 A | * | 11/1987 | Patel ........................... | 714/761 |
| 4,833,679 A | * | 5/1989 | Anderson et al. ............ | 714/758 |
| 4,849,975 A | * | 7/1989 | Patel ........................... | 714/761 |
| 4,928,280 A | * | 5/1990 | Nielson et al. ............. | 714/762 |
| 5,040,179 A | | 8/1991 | Chen | |
| 5,422,895 A | * | 6/1995 | Nguyen et al. ............. | 714/756 |
| 5,640,286 A | | 6/1997 | Acosta et al. | |
| 5,689,727 A | | 11/1997 | Bonke et al. | |
| 5,812,564 A | | 9/1998 | Bonke et al. | |
| 5,818,855 A | | 10/1998 | Foxcroft | |

OTHER PUBLICATIONS

Stephen B. Wicker, "Error Control Systems for Digital Communication and Storage", Prentice Hall, 1995.*

* cited by examiner

Primary Examiner—Albert Decady
Assistant Examiner—Joseph D. Torres
(74) Attorney, Agent, or Firm—John F. Schipper (57) ABSTRACT

A method for computing Reed-Solomon error control checkbytes in reduced time and with reduced gate count. Two syndromes, s0 and s1, are computed for a sequence of data elements, using a selected primitive a that satisfies a selected primitive polynomial relation $p(\alpha)=0$. Each of two checkbytes, c0 and c1, is expressed as a linear combination of the syndromes s0 and s1, where each coefficient of each linear combination is expressed as a single power of the primitive $\alpha$, which is stored at the checkbyte generator for multiple use. This approach reduces gate count and associated time delay in formation of the usual Reed-Solomon multiplier coefficients.

8 Claims, 7 Drawing Sheets

REED-SOLOMON MULTIPLICATION METHOD

FIELD OF THE INVENTION

This application is related to a patent application, "MODIFIED REED-SOLOMON MULTIPLICATION", U.S. Ser. No. 09,317,489, filed on the day this application is being filed. This invention relates to use of error control techniques to detect and correct errors in a digital signal, and to efficient use of Reed-Solomon error detection and correction.

BACKGROUND OF THE INVENTION

Approaches for error control encoding for computer communications have been proposed and used for more than 40 years. Error control is of increasing concern as the speed of digital signal transmission increases by factors of ten each decade. Several error control schemes, such as those developed by Reed-Solomon (RS) and by Bose-Chaudhuri-Hocquenhem (BCH), allow correction of "burst" errors of several consecutive bytes and are of special interest in computer communications. These error control schemes are powerful and allow detection and correction of isolated bit errors and burst errors involving several consecutive erroneous bits or bytes. However, the encoding and decoding procedures are often long and complex, which limits digital signal throughput at the transmitting end and/or at the receiving end where these error control methods are used. A Reed-Solomon error control procedure typically requires matrix multiplication, or its equivalent, of large row and/or column matrices as part of the syndrome processing. These multiplications require a relatively large gate count in an HDL (hardware description language) formulation and add substantially to the time required for such processing.

What is needed is an approach for reducing the gate count for pairwise multiplication in a Reed-Solomon error control procedure and for decreasing the time required to form and to sum these pairwise products. Preferably, the system should work with any reasonable coding block dimensions and with any primitive polynomial used for Reed-Solomon encoding.

SUMMARY OF THE INVENTION

These needs are met by the invention, which provides a method and system for reducing the number of gates required and for decreasing the time required to form sums of products of pairs of elements, by using a parallel process to calculate the checkbyte(s) in an ECC processing phase for digital signals. The coefficients needed to form the sums of products are built into and provided within the syndrome generator and checkbyte generator modules so that these coefficients need not be computed each time.

DESCRIPTION OF BEST MODE OF THE INVENTION

Figure 1:
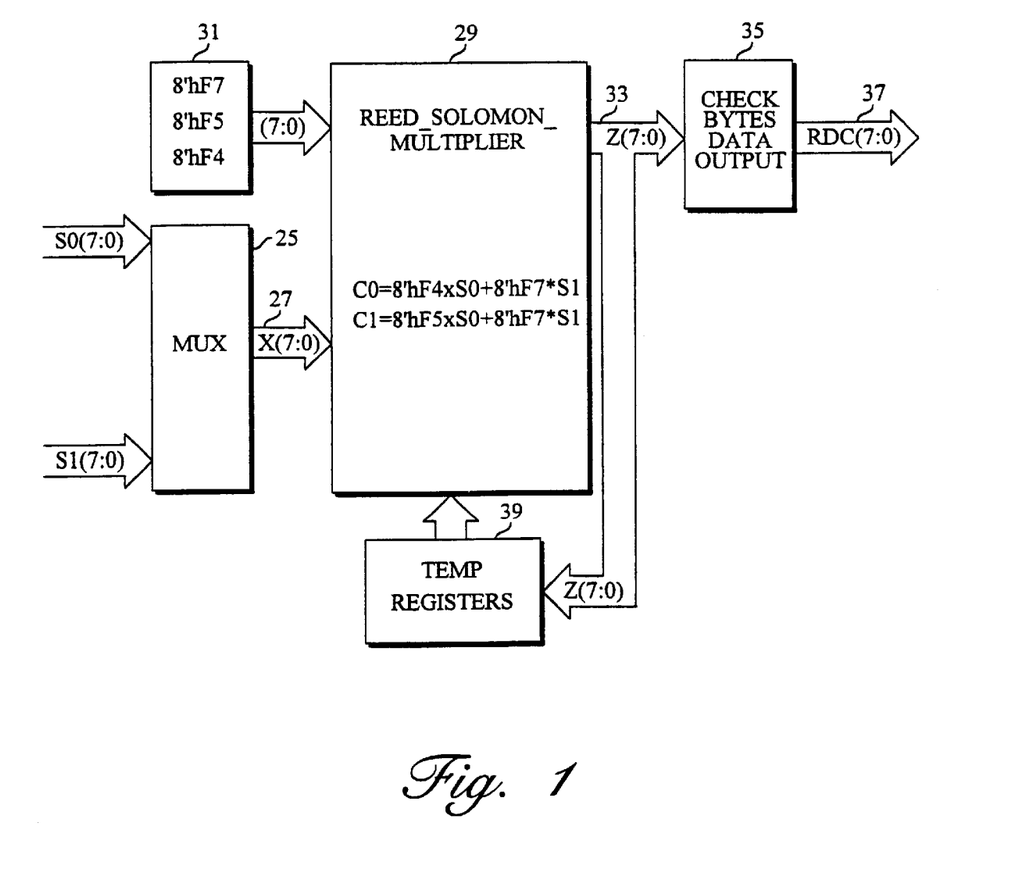
FIG. 1 illustrates data flow within an ECC module.

FIG. 1 illustrates apparatus that can be used to form and apply two multipliers that are used in Reed-Solomon error control for certain digital signals, such as the ECC phase of error control. Syndrome coefficients, s0 and s1, are received by a multiplexer 25, which selectively interleaves the s0 and s1 signals and passes the interleaved stream on one or more lines 27 to a Reed-Solomon multiplier module 29 that also receives three known eight-bit multiplier coefficients 8'hf4, 8'hf5 and 8'hf7 from a lookup table or generator 31. The MUX 29 forms eight-bit Reed-Solomon error control XOR sums:

$$c0 = 8'hf4 \cdot s0 \oplus 8'hf7 \cdot s1; \tag{1}$$

$$c1 = 8'hf5 \cdot s0 \oplus 8'hf7 \cdot s1. \tag{2}$$

The MUX 29 issues the error control sums c0 and c1 on a line 33 that is received and processed by a checkbyte error examination module 35 and is issued on an output line 37. Optionally, the error control sums c0 and c1 are also fed to a second group of temporary registers 39 that feed these sums back to the MUX 29. Formation of the sums c0 and c1 requires use of many logic gates and consumes several gate cycles in time, because of the sequential processing required.

Figure 2:
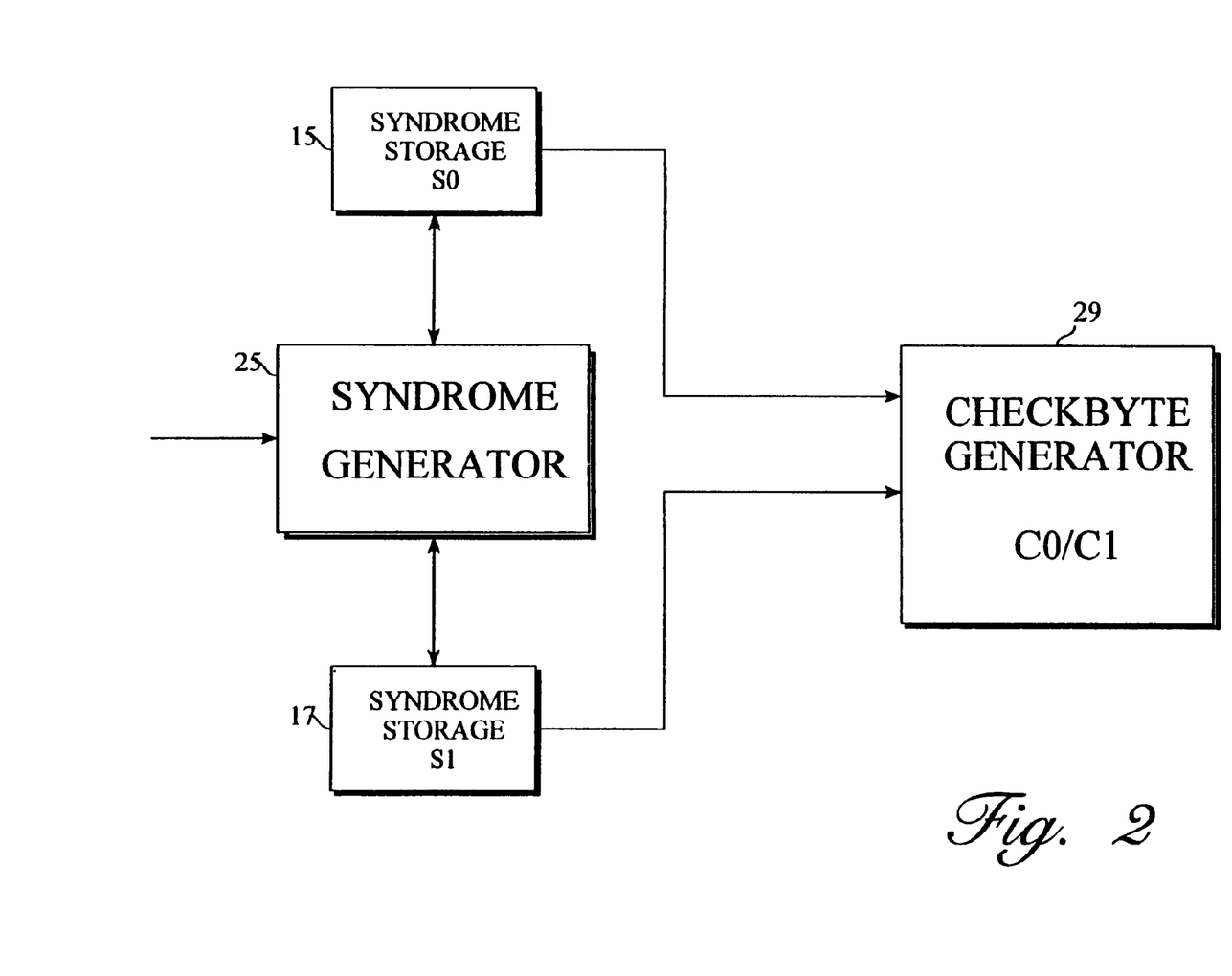
FIG. 2 illustrates generation, storage and use of the syndrome components to form checkbyte components according to the invention.

The gate count and the cumulative processing time can be reduced in the formation of the product sums c0 and c1, according to the invention. FIG. 2 illustrates apparatus suitable for generating (in 25), storing (in 15 and 17) and using (in 29) syndrome components that are, in turn, used to form the checkbyte components used in Reed-Solomon error control, using an array of eight-bit variables, $x[7:0] = \{x[k] | k=0, 1, \ldots, 7\} = \{x[7], x[6], x[5], x[4], x[3], x[2], x[1], x[0]\}$ and $y[7:0] = \{y[k] | k=0, 1, \ldots, 7\}$. The eight-bit variables $x[7:0]$ involve powers $\alpha^n$ ($n=0, 1, \ldots, 7$) of an eight-bit primitive $\alpha$, that satisfies a selected primitive polynomial relation $$p(\alpha) = 0. \tag{3}$$

For example, the primitive polynomial relation may be selected to be $$p(\alpha) = \alpha^8 + \alpha^4 + \alpha^3 + \alpha^2 + 1 = 0, \tag{4}$$

in which event the "0" element, the "1" element and several powers of $\alpha$ become $0 = \{0,0,0,0,0,0,0,0\}$, $\alpha^0 = \alpha^{255} = \{0,0,0,0,0,0,0,1\} = 1$, $\alpha = \{0,0,0,0,0,0,1,0\}$, $\alpha^2 = \{0,0,0,0,0,1,0,0\}$, $\alpha^3 = \{0,0,0,0,1,0,0,0\}$, $\alpha^4 = \{0,0,0,1,0,0,0,0\}$, $\alpha^5 = \{0,0,1,0,0,0,0,0\}$, $\alpha^6 = \{0,1,0,0,0,0,0,0\}$, $\alpha^7 = \{1,0,0,0,0,0,0,0\}$, $\alpha^8 = \{0,0,0,1,1,1,0,1\} = \alpha^4 + \alpha^3 + \alpha^2 + 1$, $\alpha^9 = \{0,0,1,1,1,0,1,0\} = \alpha \cdot \alpha^8 = \alpha^5 + \alpha^4 + \alpha^3 + \alpha$, $\alpha^{230} = \{1,1,1,1,0,1,0,0\}$, $\alpha^{231} = \{1,1,1,1,0,1,0,1\}$, $$\alpha^{232} = \{1,1,1,1,0,1,1,1\}, \tag{5}$$

where particular powers $\alpha^n$ ($n=230, 231, 232$) will be needed in the following development. The remaining powers an ($10 \leq n \leq 254$) are generated using the particular primitive polynomial relation (4). Change of the choice of primitive polynomial will cause a corresponding change in definition of most of the powers of $\alpha$.

Figure 3:
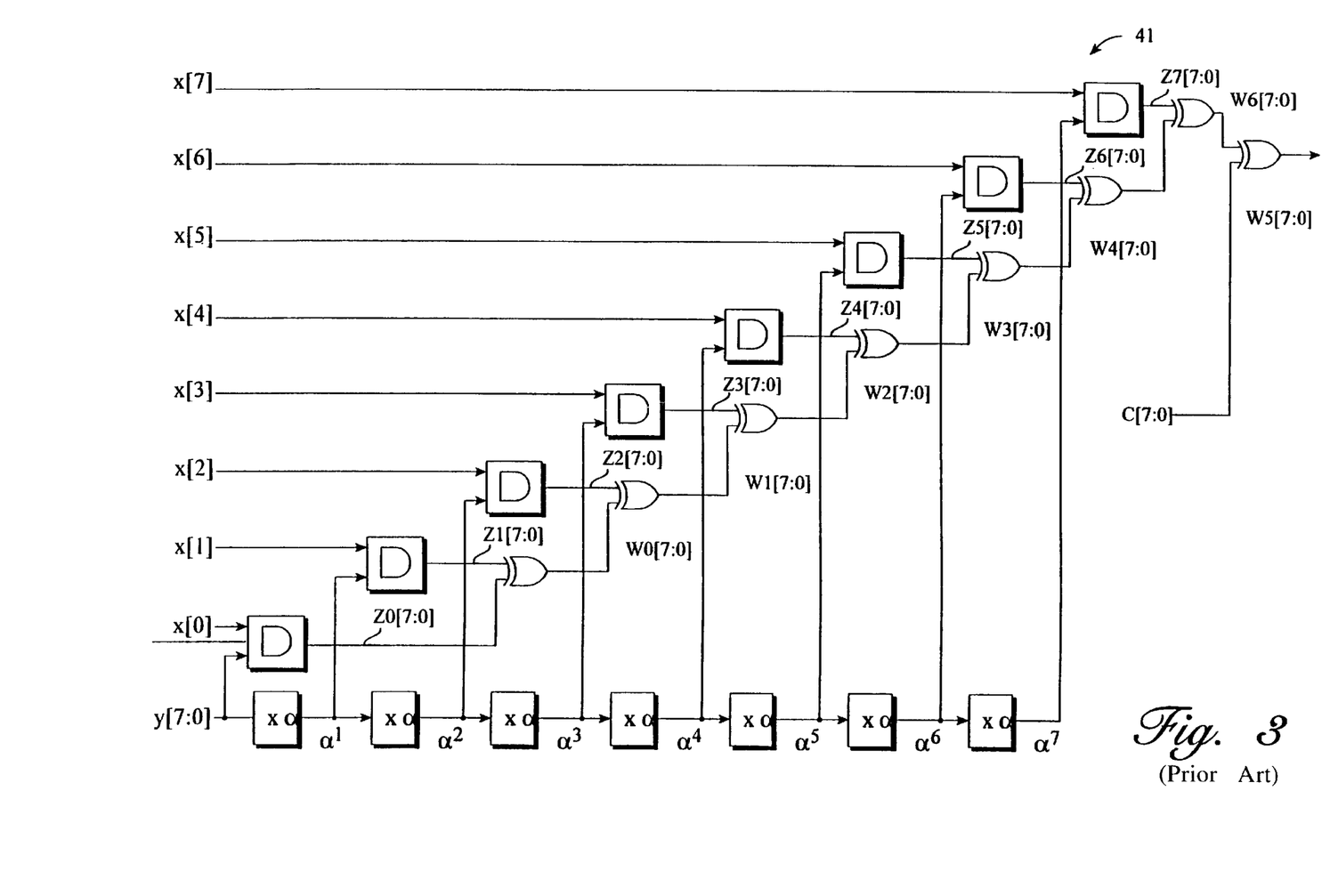
FIG. 3 (prior art) shows conventional apparatus for implementing certain sums and products.

The following arrays of coefficients are formed, for example using the conventional apparatus shown in FIG. 3, where $x[k]$ is a scalar and $y[7:0]$ is an eight-bit array.

$$x[0] \cdot y[7:0] = z0[7:0], \quad (6\text{-}0)$$

$$x[1] \cdot y[7:0]\alpha = z1[7:0], \quad (6\text{-}1)$$

$$\ldots$$

$$x[k] \cdot y[7:0]\alpha^k = zk[7:0] \, (k=0, 1, \ldots, 7), \quad (6\text{-}k)$$

$$w0[7:0] = z0[7:0] + z1[7:0], \quad (7\text{-}0)$$

$$w(k+1)[7:0] = zk\{7:0\} + wk[7:0] \, (k=0, 1, \ldots, 5), \quad (7\text{-}k)$$

$$w6[7:0] + c[7:0] = w7[7:0], \quad (7\text{-}6)$$

where $zk[7:0]$ also has eight entries, obtained by multiplying each of the eight entries in $y[7:0]$ by the scalar $x[k]$, and $c[7:0]$ is a portion of a checkbyte c0 or c1. The variables $x[7:0]$ and $y[7:0]$ may be taken to be any of the pairs $\{s0,8'hf4\}$, $\{s0,8'hf5\}$ and $\{s1,8'hf7\}$ that appear in the relations(1) and (2).

The checkbytes c0 and c1 are formed as follows. Two code word variables s0 and s1 are defined by $$s0 = \sum_{n=0}^{N} I(n) \cdot 1 = \{I(0) + I(1) + \cdots + I(N)\} \cdot 1 \quad (8)$$

$$s1 = \sum_{n=0}^{N} I(n) \cdot \alpha^n \quad (9)$$

where, for example, the choices N=24 and N=43 correspond to P-parity correction and Q-parity correction, respectively, and $I(n)$ is one of a column of data elements. Two 16-bit check bytes, $c0=c0[15:8]+c0[7:0]$ and $c1=c1[15:8]+c1[7:0]$, are added for every code word to detect up to two errors per code word and to allow correction of up to one error per code word.

The check bytes c0 and c1 satisfy the error check relations $$c1 + c0 + s0 = 0, \quad (10)$$

$$c1 + c0\,\alpha + s1\,\alpha^2 = 0. \quad (11)$$

One verifies from the relations (5), (10) and (11) that $$(1+\alpha) \cdot c0 = s0 + \alpha^2 \cdot s1 \quad (12)$$

$$c1 = c0 + s0, \quad (13)$$

$$c0 = (1 + \alpha)^{-1}\{s0 + \alpha^2 \cdot s1\} \quad (14)$$
$$= \alpha^{-25}\{s0 + \alpha^2 \cdot s1\} = \alpha^{255-25}s0 + \alpha^{257-25} \cdot s1$$
$$= \alpha^{230} \cdot s0 + \alpha^{232} \cdot s1$$
$$= 8'hf4 \cdot s0 + 8'hf7 \cdot s1,$$

$$c1 = \alpha^{231} \cdot s0 + \alpha^{232} \cdot s1 \quad (15)$$
$$= 8'hf5 \cdot s0 + 8'hf7 \cdot s1,$$

which exhibit the values of the (now-known) eight-bit coefficients 8'hf4, 8'hf5 and 8'hf7. Higher order coefficients can be computed in a similar manner. Where the arrays x and y have the forms $$x = x^7\alpha^7 + x^6\alpha^6 + x^5\alpha^5 + x^4\alpha^4 + x^3\alpha x^3 + x^2\alpha^2 + x^1\alpha^1 x^0\alpha^0,$$

$$y = y^7\alpha^7 + y^6\alpha^6 + y^5\alpha^5 + y^4\alpha^4 + y^3\alpha^3 + y^2\alpha^2 + y^1\alpha^1 + y^0\alpha^0,$$

the product $x*y$ of these arrays is defined as $$x*y = x^7y\alpha^7 + x^6y\alpha^6 + x^5y\alpha^5 + x^4y\alpha^4 + x^3y\alpha^3 + x^2y\alpha^2 + x^1y\alpha^1 + x^0y. \quad (16)$$

The coefficients 8'hf4, 8'hf5, 8'hf7 and others are part of an array of coefficients defined as follows.

$$8'hf5 = 8'hf4 \, \alpha,$$
$$8'hf7 = 8'hf5 \, \alpha,$$
$$8'hf3 = 8'hf7 \, \alpha,$$
$$8'hfb = 8'hf3 \, \alpha,$$
$$8'heb = 8'hfb \, \alpha,$$
$$8'hcb = 8'heb \, \alpha,$$
$$8'h8b = 8'hcb \, \alpha,$$
$$8'h0b = 8'h8b \, \alpha, \, 8'h16 = 8'h0b \, \alpha, \quad (17)$$

where additional higher terms in this array can also be defined, if desired, based on a Gray code expressed in hexadecimal format. The quantities in (17) may be computed once and stored in software or hardware, and these quantities (and higher order coefficients) are considered known.

The input quantities s0 and s1 are characterized as sums of powers of $\alpha$, as in (8) and (9). For example, the quantities 8'hf4·s0 and 8'hf5·s0 in the relations (14) and (15) are the product of the coefficients 8'hf4 and 8'hf5=8'hf4·$\alpha$ multiplied by a known numerical coefficient times a known power of a and are easily computed once and stored, without requiring recomputation of different (positive) powers of $\alpha$.

Each of the quantities 8'hf4·s0, 8'hf5·s0 and 8'hf7·s1, if expressed in a conventional manner, will require use of approximately 3N−1 gates, including N−1 gates that form selected powers $\alpha^m$ (m=1, 2, ..., N−1), as illustrated in FIG. 3, and will require a substantial total time delay for the sequential operations indicated in FIG. 3. However, if the parity input quantity si is expressed as an (N+1)-tuple $S1=\{s1[0], s1[1], s1[2], \ldots, s1[N]\}$, the gate count can be reduced substantially (to N) by forming the usual logical product (AND) of a sequence of coefficients $\alpha^k$·8'hf7 with each a sequence of coefficients $s1[k]$ in the k-tuple S1.

Figure 4:
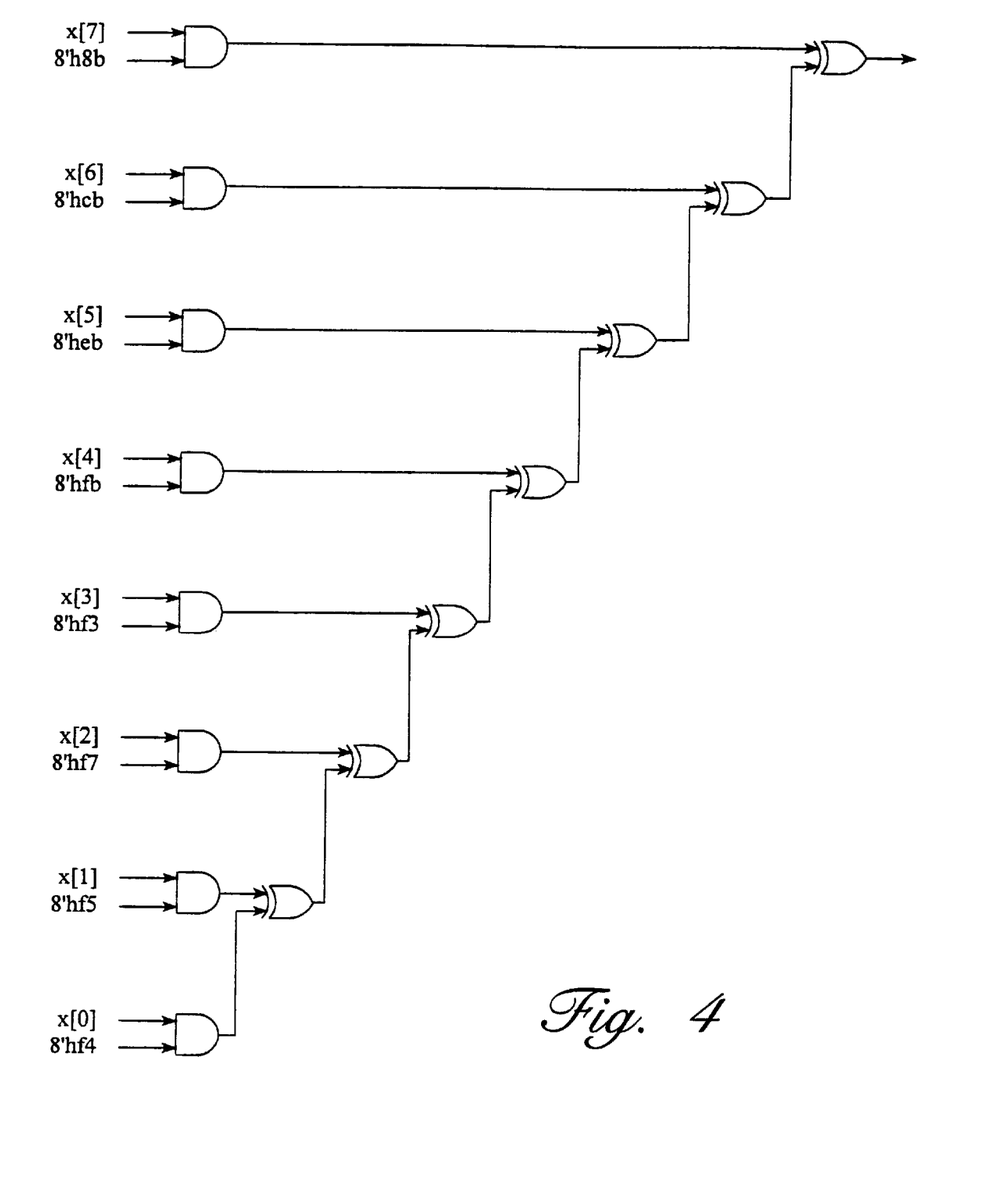
FIGS. 4, 5 and 6 show apparatus for implementing Reed-Solomon multiplier action according to the invention.

FIG. 4 shows apparatus suitable for implementing, according to the invention, formation of the Reed-Solomon products or multipliers used to define c1 in (15), for the choice N=7. The number of gates required is reduced from 3N−1=23 in FIG. 3 to 2N−1=15 in FIG. 4. More generally, the coefficients in (17) would include N+1 pre-computed input signals 8'hf4, $\alpha$·8'hf4, $\alpha^2$·8'hf4, ..., $\alpha^N$·8'hf4, each directed to a separate two-input AND gate, with the input signals to the other terminal of each AND gate being the scalar quantities $s1[n]$ (n=0, 1, 2, ..., N). The computed quantities 8'hf4·$\alpha^k$ (k=0, 1, 2, ...) are preferably stored in a look-up table for subsequent use. Preferably, the coefficients 8'hf7·$\alpha^k$ are provided in groups of N+1=8.

Figure 5:
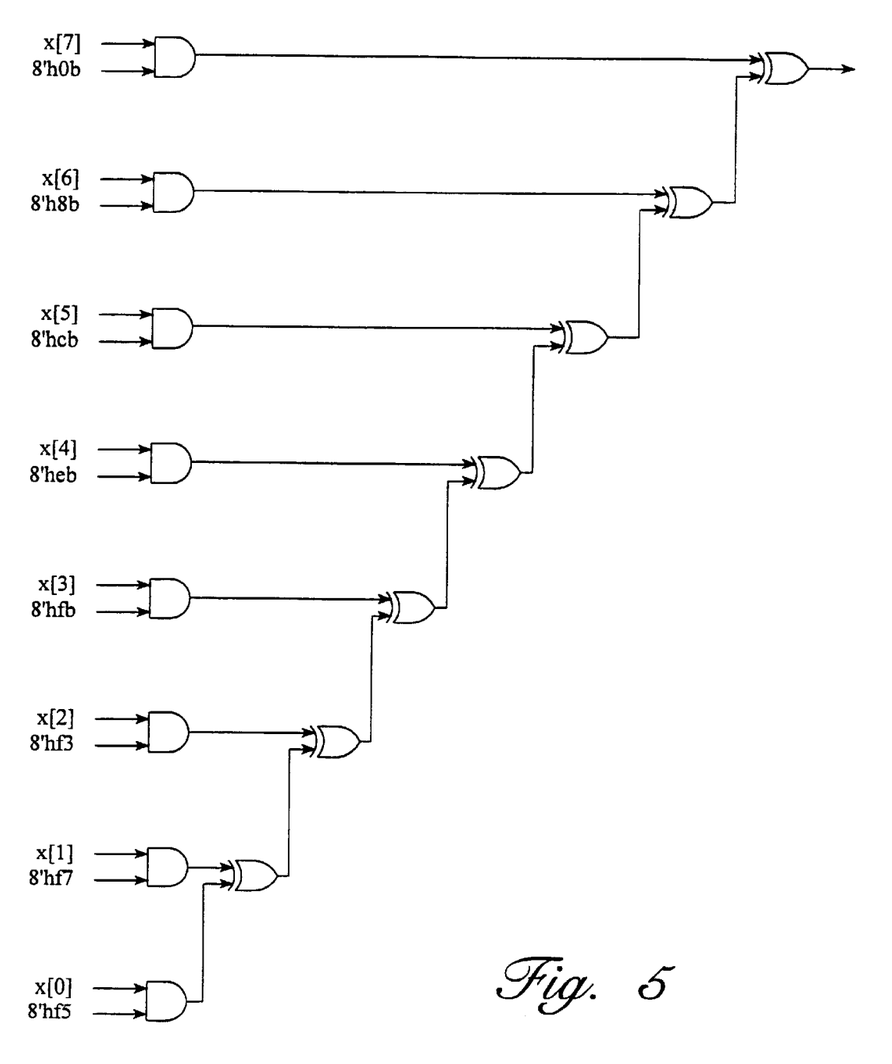

FIG. 5 shows apparatus suitable for implementing formation of the Reed-Solomon multipliers used to define c0 in (14), where the input signals are the quantities 8'hf5·s0 (k=0, 1, 2, ...). Here, each of the input signals for the first terminal of the AND gates have the same value, such as 8'hf5.

Figure 6:
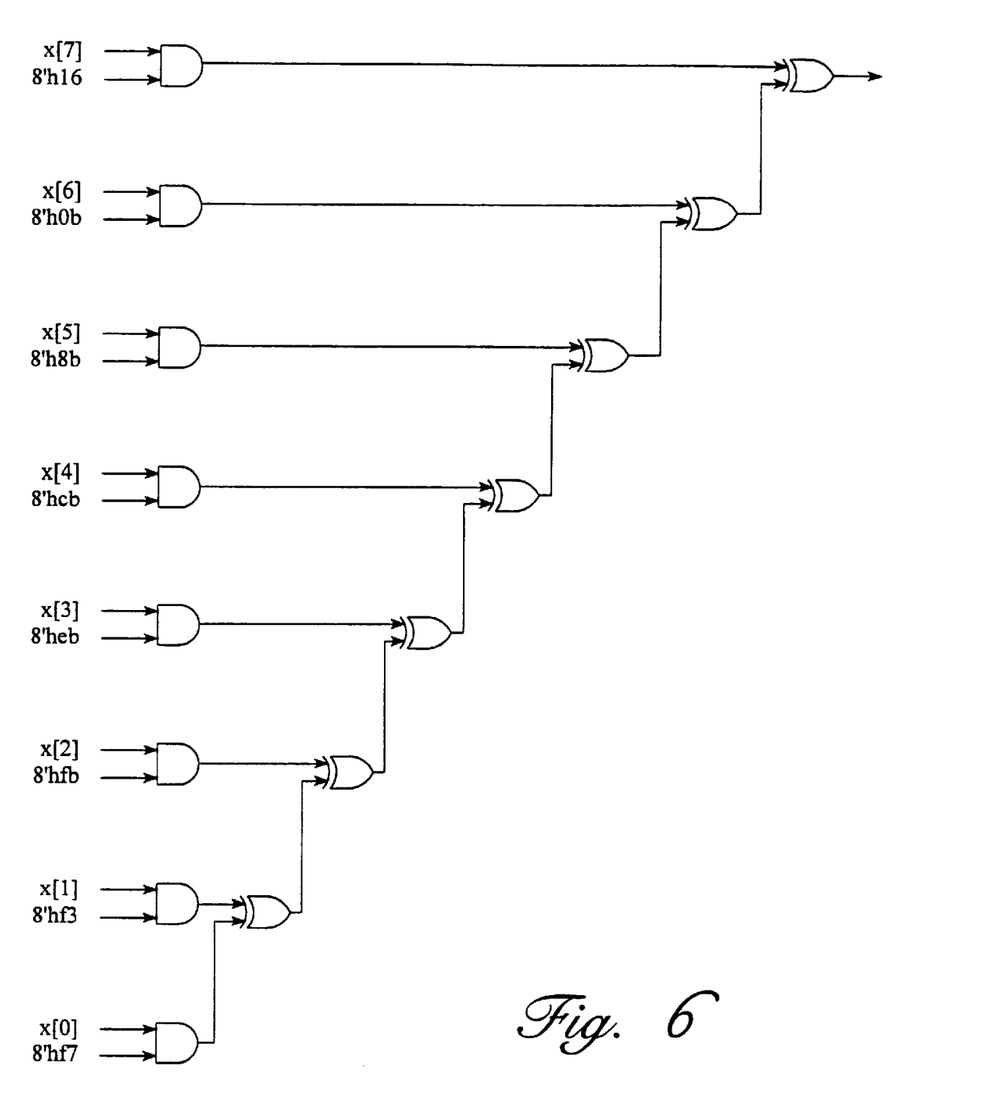

Similarly, FIG. 6 shows apparatus suitable for implementing the input signals 8'hf7·s1. (k=0, 1, 2, ...).

The control bytes c0 and c1 are formed as indicated in (14) and (15) and are appended to the binary representation $\{I(0), I(1), \ldots, I(N)\}$ to implement a Reed-Solomon error control procedure.

Figure 7:
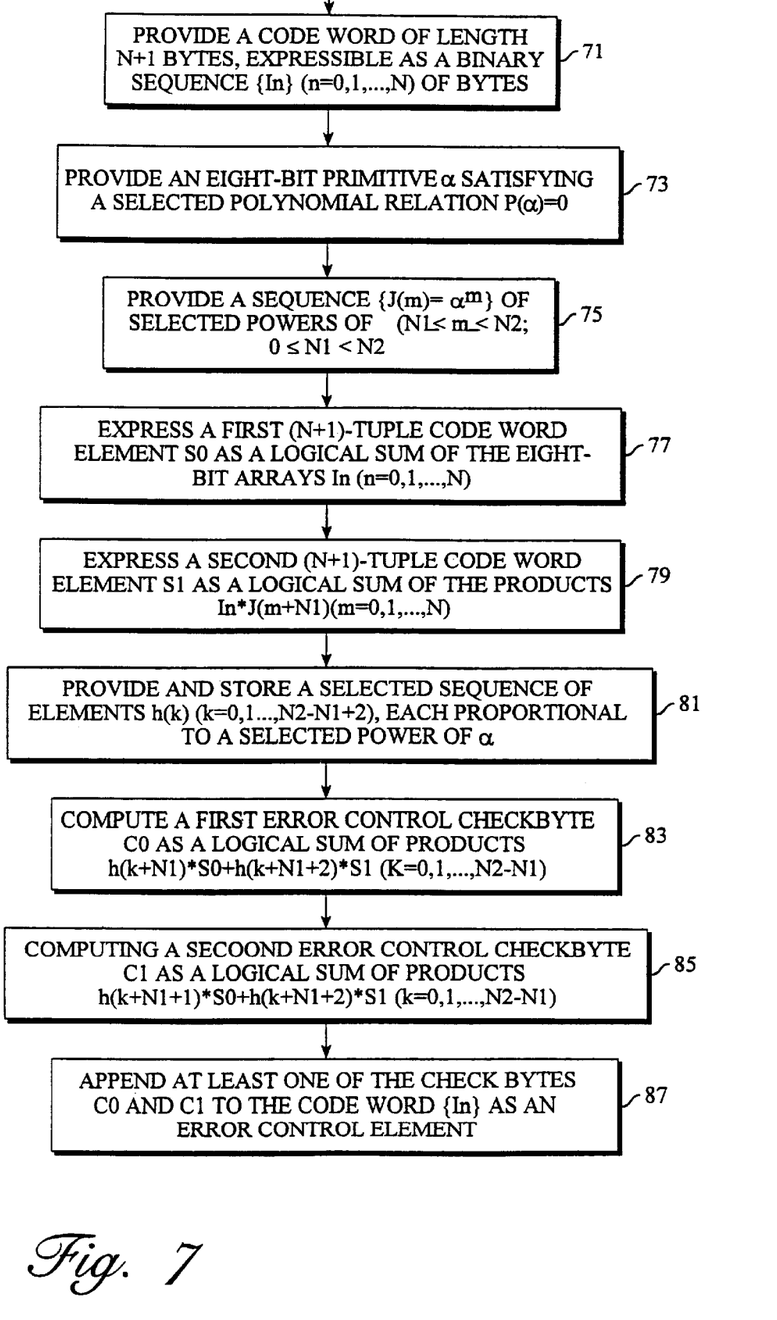
FIG. 7 is a flow chart illustrating practice according to the invention.

FIG. 7 is a flow chart illustrating one method of practicing the invention. In step 71, a code word of length N+1 eight-bit arrays, expressible as a binary sequence $\{I_n\}$ of bytes (n=0, 1, ..., N), is provided. In step 73, an eight-bit primitive a satisfying a selected primitive polynomial relation p(α)=0, is provided. In step 75, a selected sequence of powers $\{J_m=\alpha^m\}$ of α is provided. In step 77, a first (N+1)-tuple code word element, s0, is computed as a logical sum of the eight-bit arrays $I_n$ (n=0, 1, ..., N). In step 79, a second (N+1)-tuple code word element, s1, is computed as a logical sum of eight-bit product arrays $I_n \cdot J(n+N1)$ (n=0, 1, ..., N). In step 81, the system provides a selected sequence {h(k)} (k=0, 1, ..., N2−N1) of eight-bit arrays, with each element being proportional to a selected power of the primitive α. In step 83, a first control element, c0, is expressed as a logical sum of products h(k+N1)·s0+h(k+N1+2)·s1 (k=0, 1, ..., N2−N1). In step 85, a second control element, c1, is expressed as a logical sum of products h(k+N1)·s0 +hk+N1+2)·s1 (k=0, 1, ..., N2−N1). The quantities c0 and c1 may be interpreted as error control checkbytes for the code word sequence $\{I_n\}$. Optionally, in step 87, at least one of the error control checkbytes, c0 and c1, is appended to the code word sequence $\{I_n\}$.

What is claimed is:

1. A method for computing error control checkbytes for a sequence of data, the method comprising:

receiving a sequence of N+1 eight-bit data elements that are to be processed for error control purposes, where N is a selected positive integer;

computing a first error control syndrome s0 as a sum of the sequence of data elements;

computing a second error control syndromes s1 as a sum of the sequence of data elements, each multiplied by a selected power of an eight-bit array α that satisfies a selected primitive polynomial relation $p(\alpha)=\alpha^8+\alpha^4+\alpha^3+\alpha^2+1=0$; and computing first and second checkbytes, c0 and c1, for the sequence of data elements as first and second linear combinations $$c0=s0\cdot\alpha^{230}\oplus s1\cdot\alpha^{232},$$

$$c1=s0\cdot\alpha^{231}\oplus s1\cdot\alpha^{232}.$$

2. The method of claim 1, further comprising:

analyzing said checkbytes, c0 and c1, together with said data element sequence, to determine when said data element sequence contains at least one data element error.

3. The method of claim 1, further comprising selecting said integer N=24.

4. The method of claim 1, further comprising selecting said integer N=43.

5. A method of error control for a digital signal, the method comprising:

providing a code word having a selected byte length N+1 and being expressible as an ordered sequence $\{I_n\}$ (n=0, 1, ..., N} of bytes, where $I_n$ (=0 or 1) is a selected numerical coefficient;

providing a primitive element α that satisfies a selected primitive polynomial equation $p(\alpha)=\alpha^8+\alpha^4+\alpha^3+\alpha^2+1=0$;

providing a selected sequence of eight-bit coefficients $J(m)=\alpha^m$ (N1≦m≦N2) that are powers of the primitive α, where N1 and N2 are selected non-negative integers satisfying N1=230 and N2=237;

computing a first (N+1)-tuple code word element, s0={s0[0], s0[1], ..., s0[N]}, as a logical sum of the sequence of numerical values $I_n$ (n=0, 1, ..., N), all multiplied by a selected identity element 1;

computing a second (N+1)-tuple code word element, s1={s1[0], s1[1], ..., s1[N]}, as a logical sum of the products $I_n\cdot J(n+N1)$;

providing and storing a selected sequence of elements h(k) (k=0, 1, ..., N2−N1 [+2]), with each element being proportional to a selected power of the primitive element α;

computing a first control element, c0, as a logical sum of products h(k+N1)·s0+h(k+N1+2)·s1 (k=0, 1, ..., N2−N1);

computing a second control element, c1, as a logical sum of products h(k+N1+1)·s0+h(k+N1+2)·s1 (k=0, 1, ..., N2−N1); and interpreting the elements c0 and c1 as error control checkbytes for the code word $\{I_n\}$.

6. The method of claim 5, further comprising:

appending at least one of said first and second checkbytes, c0 and c1, to said sequence $\{I_n\}$.

7. The method of claim 5, further comprising selecting said integer N=24.

8. The method of claim 5, further comprising selecting said integer N=43.

* * * * *